United States Patent [19]
Hawkins et al.

[11] Patent Number: 5,201,987
[45] Date of Patent: Apr. 13, 1993

[54] FABRICATING METHOD FOR SILICON STRUCTURES

[75] Inventors: William G. Hawkins, Webster; Donald J. Drake, Rochester; James F. O'Neill, Penfield, all of N.Y.

[73] Assignee: Xerox Corporation, Stamford, Conn.

[21] Appl. No.: 899,597

[22] Filed: Jun. 18, 1992

Related U.S. Application Data

[63] Continuation of Ser. No. 533,203, Jun. 4, 1990, abandoned.

[51] Int. Cl.$^5$ .................. H01L 21/306; B44C 1/22; C03C 15/00; C03C 25/06
[52] U.S. Cl. .................... 156/633; 156/643; 156/644; 156/645; 156/647; 156/653; 156/657; 156/661.1; 156/662
[58] Field of Search ............... 156/643, 644, 645, 647, 156/651, 653, 657, 661.1, 662, 663, 659.1; 346/1.1, 140 R

[56] References Cited

U.S. PATENT DOCUMENTS

| | | | |
|---|---|---|---|
| Re. 32,572 | 1/1988 | Hawkins et al. | 156/626 |
| 3,654,000 | 4/1972 | Totah et al. | 156/17 |
| 4,585,513 | 4/1986 | Gale et al. | 156/630 |
| 4,683,646 | 8/1987 | Kando et al. | 29/611 |
| 4,899,181 | 2/1990 | Hawkins et al. | 346/140 R |
| 5,006,202 | 4/1991 | Hawkins et al. | 156/644 |

*Primary Examiner*—William A. Powell
*Attorney, Agent, or Firm*—Robert A. Chittum

[57] ABSTRACT

A precision etched, three dimensional device is fabricated from a silicon wafer by etching from one side of the wafer. A chemical masking layer, such as silicon nitride, is first deposited on all sides of the wafer, followed by the deposition of a robust mechanical layer, such as polycrystalline silicon, over the masking layer on all sides of the wafer. The two layers are sequentially patterned on one side of the wafer and then the wafer is placed into an etchant bath which etches the exposed surface of the wafer and concurrently removes the protective layer, leaving a defect-free masking layer that prevents unintentional etching that would reduce yields of fabricated devices.

12 Claims, 4 Drawing Sheets

FABRICATING METHOD FOR SILICON STRUCTURES

This is a continuation of application Ser. No. 07/533,203 filed Jun. 4, 1990, now abandoned.

BACKGROUND OF THE INVENTION

1. Field of the Invention

This invention relates to fabrication of precision etched, three dimensional electromechanical or mechanical structures from silicon wafers, and more particularly to a method of precision etching of the frontside of a chemically masked silicon wafer using a single step etching process, while concurrently preventing crack producing damage to the etch resistant mask on the backside of the wafer, so that unintentional backside etching does not occur through such backside cracks. Backside etching will reduce the yield of frontside etched silicon structures as in, for example, ink flow-directing channel plates of ink jet printheads. A concurrently filed application by the same inventors and assignee, now U.S. Pat. No. 5,006,202, entitled "Fabricating Method for Silicon Devices Using a Two Step Silicon Etching Process" discloses a similar invention using two step silicon etching process for higher dimensional control.

2. Description of the Prior Art

In wafer etching applications where precision etching of the frontside of a silicon wafer is required to produce electromechanical or mechanical structures or devices, the yield of such devices is often lowered because of damage to the backside masking layer of the wafer, thus allowing unintentional backside etching. Backside etch defects can destroy yield of frontside die, such as, for example, thermal ink jet channel plates. Additionally, backside etch defects can interfere with vacuum pickup required to spin wafers on a chuck for photoresist application or development.

Backside masking thin films can be quite delicate and subject to mechanical damage during the normal wafer handling required for processing. An example of a common masking layer is silicon nitride, which is chemical vapor deposited as a tensilely stressed film. While silicon nitride has generally excellent etch resistance to a wide variety of useful chemical etches, its tensile stress makes it tend readily to crack open, since a spreading crack relieves the internal tensile stress. This means that any mechanical contact of the backside coat of silicon nitride tends to form open cracks which will result in backside etch defects.

U.S. Pat. No. 4,683,646 to Kando et al discloses a thermal printhead and method of manufacture therefor which provides reduced risk of damage during the separation of individual printheads from the plurality of printheads formed on a single substrate. Since the heating elements require both an oxidation resisting layer and a wear resistant film thereover, the electrode interface board and heating element containing section are manufactured separately and then electrically mated to eliminate the need to cover the electrode interface with the oxidation resisting layer and the wear resistant layer. The heating element portion of the thermal printer is patterned along the length of lands formed by anisotropic etching of parallel, flat bottomed grooves in a silicon wafer. Linear arrays of parallel heating elements are formed along each land with associated parallel metal electrodes connecting adjacent heating elements across the flat-bottomed grooves, so that the heating elements are centerraised. The electrodes connected to the heating elements form parallel stripes in the grooves between heating elements. A removable reinforcing film is deposited over the heating elements and electrodes. The opposite side of the silicon wafer is lapped or etched off to expose the underside of the electrodes in the grooves. The wafer is diced to produce individual linear arrays of heating elements and the reinforcing film is removed, prior to mating of the heating element array with an electrode interface board which provides contact pads for outside electrical input.

U.S. Pat. No. 4,585,513 to Gale et al discloses a method of removing the exposed portion of a glass support plate mounted within a stepped recess of a housing, the recess having an opening in the bottom thereof to expose the glass plate. A thin flat single crystalline silicon member is adhered to the side of the glass plate opposite the side confronting the recess opening. A backing plate is adhered to the surface of the silicon member having circuitry thereon and opposite to the surface bonded to the glass plate. A protective material is deposited over the backing plate and any portion of the silicon member not covered by the backing plate. The glass plate exposed through the recess opening in the housing is etched to remove all of the exposed glass plate, and exposing the silicon member.

U.S. Pat. No. 3,654,000 to Totah et al discloses a wafer of silicon material containing semiconductive devices on one side and an oxide coating on the other side. A first rigid support plate is temporarily adhered to the semiconductive devices and the surface of the wafer containing them. The opposite side of the wafer having the oxide coating is masked and aligned in conformity with the devices on the other side. The oxide coating is selectively etched and the mask is removed, leaving the oxide to serve as mask for etching through the silicon wafer. A second rigid support plate is temporarily adhered to the oxide and exposed silicon walls to maintain the individual die with semiconductive devices in the original matrix locations when the first support plate and adhering material is removed to expose the devices for testing prior to removal of the second support plate. The invention is to etch the silicon material containing the semiconductive devices instead of scribing lines and breaking the wafer into discrete devices.

SUMMARY OF THE INVENTION

It is an object of the present invention to provide mechanically protective film on the backside of silicon wafers over the backside chemical masking layer, so that an undamaged masking layer protects the wafer backside from etch damage. The mechanically protective film protects the integrity of the masking film by preventing mechanical damage thereto which leads to cracks that expose the wafer and enable unintentional etching.

It is another object of the present invention to provide a two-sided deposition of a robust mechanical damage protecting layer on top of a two-sided deposition of a chemical masking layer on a silicon wafer, in which the same type chemistry for pattern etching the mechanical damage protecting layer on the frontside of the wafer may be used to pattern the underlying chemical masking layer.

It is still another object of the present invention to provide a mechanical damage protecting layer that etches in the etchant used to etch the silicon wafer, so that the mechanical damage protecting layer is quickly removed in the etch bath, leaving the defect free chemical masking layer exposed on a completely etched wafer.

It is yet another object of the present invention to use existing MOS integrated circuit compatible deposition and processing techniques to achieve a high level of protection.

In the present invention, a method of fabricating a precision etched, three dimensional device from a silicon wafer is described. An example is an ink flow directing channel plate which, when aligned and mated with a heater plate containing an array of a selectively addressable heating elements, forms a thermal ink jet printhead. The wafer has a frontside and a backside, the frontside alone being etched to form recesses therein. A chemical masking layer, such as silicon nitride, is deposited on the frontside and backside of the wafer, followed by the deposition thereover of a mechanical damage protective layer, such as polycrystalline silicon. A photoresist layer is applied to the frontside of the protective layer on the wafer by, for example, mounting the backside of the wafer in a spin chuck and spin coating a layer of photoresist on the wafer frontside surface. During the application of the photoresist on the frontside of the wafer, the backside masking layer is protected from crack producing mechanical damage. The photoresist layer is patterned to produce a predetermined pattern of vias therein, and then both the protective layer and masking layer are plasma etched. The patterned photoresist layer is stripped and the wafer placed in an etch bath, where the frontside wafer surface is etched to form recesses therein and concurrently the protective layer is removed. If multiple devices are etched in the wafer, the next step is to separated them by a dicing operation.

In an alternate embodiment, the frontside protective layer is removed, after covering the backside protective layer with a photoresist layer, and then removing the photoresist layer, so that the backside protective layer remains to prevent damage to the underlying masking layer, but is removed from the frontside so that only the masking layer must be patterned.

In another embodiment, the protective layer is deposited only on the backside. Such a protective layer must be of a material and have an application process which may be deposited and removed without damage to either frontside or backside masking layer, such as, for example, thermally evaporated aluminum.

A more complete understanding of the present invention can be obtained by considering the following detailed description in conjunction with the accompanying drawings wherein like index numerals indicate like parts.

DETAILED DESCRIPTION OF THE PREFERRED EMBODIMENT

Figure 5:
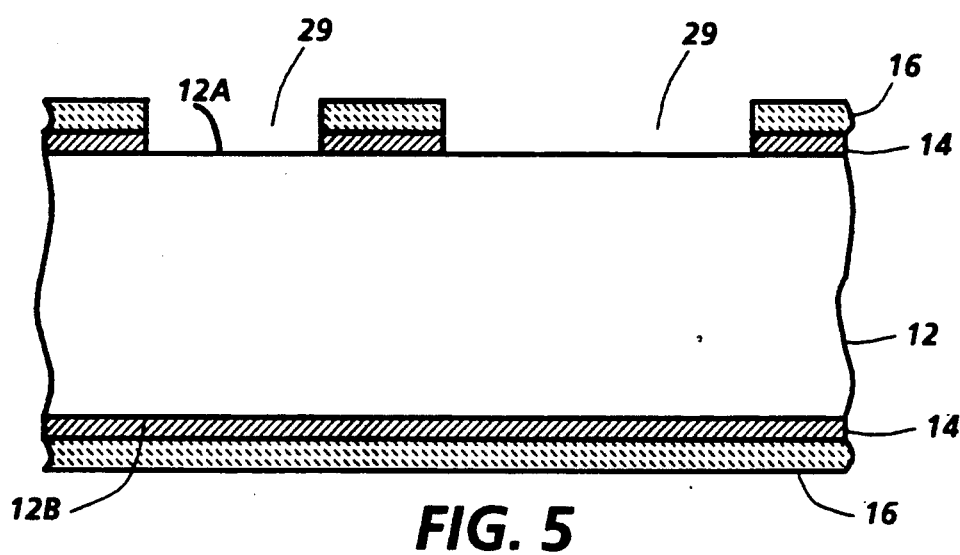
Figure 6:
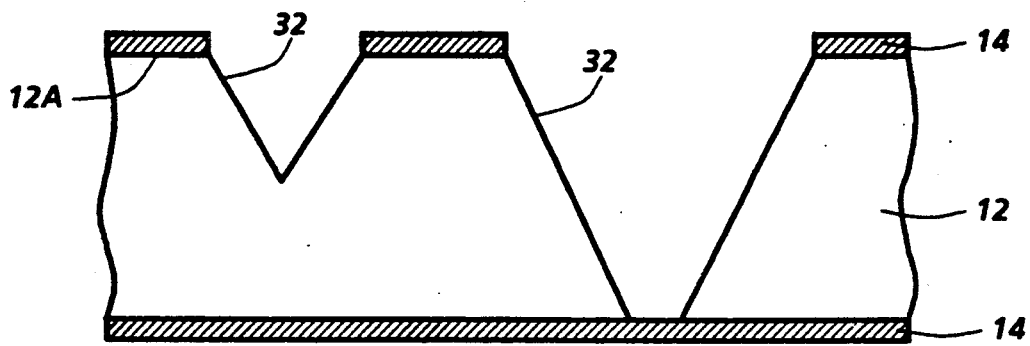
Figure 7:
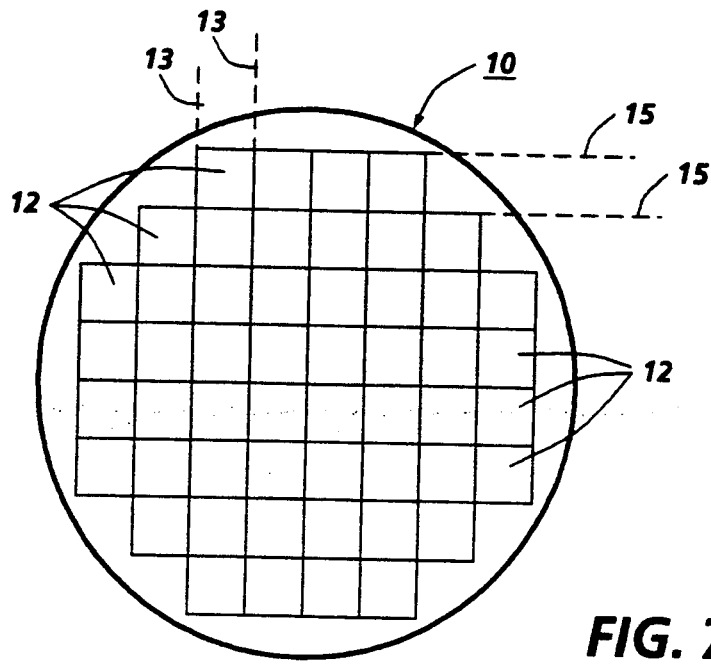
FIG. 7 is a schematic plan view of a silicon wafer having a plurality of devices etched therein.
Figure 8:
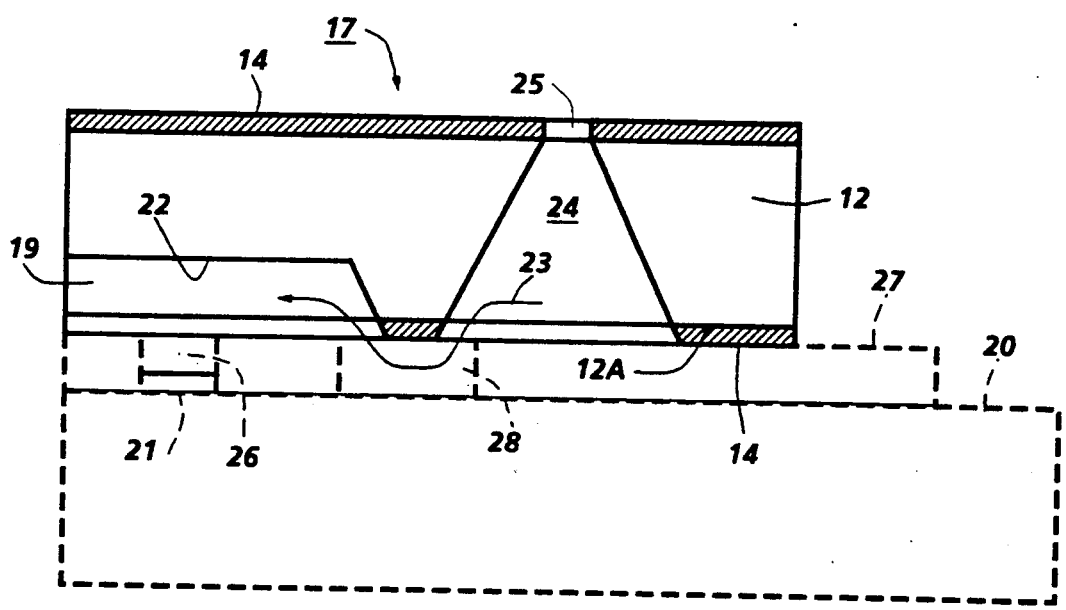
FIG. 8 is an enlarged, cross-sectional view of an etched channel plate as an example of an etch-fabricated three dimensional device, after separating the devices shown in FIG. 7 by a dicing operation.

A method of fabricating one or a plurality of precision etched, three dimensional structures 12 from a (100) silicon wafer 10 is shown in FIGS. 1 to 7. Referring to FIG. 7, a plurality of precision etched structures 12 are schematically depicted in the plan view of a silicon wafer after the completion of the fabricating steps delineated in FIGS. 1-6, discussed below, and prior to dicing of the wafer along mutually perpendicular vertical and horizontal dashed dicing lines 13, 15, respectively. In FIG. 8, a typical example of a precision etched silicon structure 12 is shown as an ink directing channel plate that may be aligned and bonded to a heating element plate 20, shown in dashed line, to produce a thermal ink jet printhead 17 of the type disclosed in U.S. Pat. Nos. 4,899,181 and Re. 32,572, both of which are incorporated herein by reference. Ink (not shown) from an external supply (not shown) enters inlet 25 under a slightly negative pressure and fills reservoir 24, a recess anisotropically etched through silicon substrate 12. An array of parallel, elongated recesses 22 which serve as ink channels are concurrently anisotropically etched with the reservoir 24. The channels are closed at the ends adjacent the reservoir and the other ends are open to serve as droplet emitting nozzles 19. As disclosed in the above referenced U.S. Pat. No. 4,899,181, ink flows from the reservoir 24 to the channels 22 through a recess 28 in a thick film insulative polymer layer 27, shown in dashed line, applied and patterned on the heating element plate 20, as shown by arrow 23. The thick film layer is also patterned to remove the thick film layer from above the heating elements 21 to form pits 26 which restrain lateral movement of temporary vapor bubbles (not shown) generated by the selective application of electrical pulses to the heating elements as well known in the art. The etch resistant mask 14, silicon nitride in the preferred embodiment is removed from the channel plate, but may optionally remain prior to assembly with the heating element plate. As disclosed in U.S. Pat. No. Re. 32,572, communication between the channels 22 and the reservoir 24 may be obtained by an etching step or by a milling operation.

Referring to FIGS. 1 to 6, the fabricating process or method will be described for the silicon structures 12, such as, for example, a channel plate as discussed above with reference to FIG. 8. Though a plurality of silicon structures may be concurrently formed from a single (100) silicon wafer, only one such structure 12 will be shown in cross section for ease in describing the process.

Figure 1:
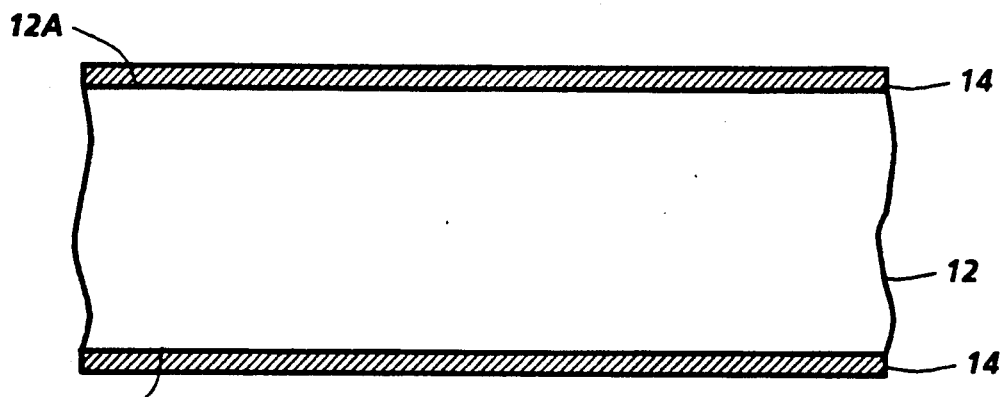
FIGS. 1-6 are cross-sectional views in various steps in fabricating a three dimensional device of the present invention.
Figure 2:
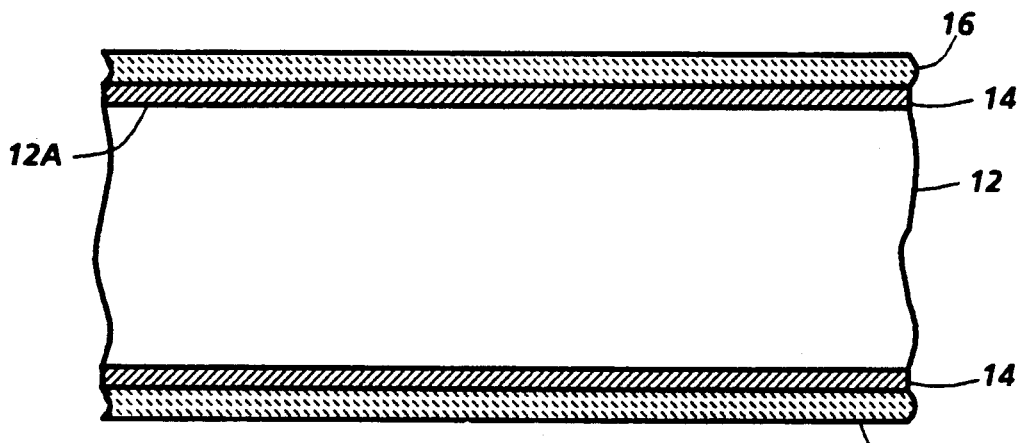

In FIG. 1, a chemical masking layer 14, preferably silicon nitride, is deposited by chemical vapor deposition (CVD) to a thickness of 0.05 to 0.5 $\mu$m on both sides of a clean silicon substrate having {100} plane frontside and backside surfaces 12A and 12B, respectively. The silicon substrate, of course, is generally a (100) silicon wafer, but other orientations are also useful for anisotropic etching. A mechanically protective layer 16, preferably polycrystalline silicon, is deposited by CVD to a thickness of 0.1 to 1.0 $\mu$m on the outer surfaces of the silicon nitride layer on both sides of the silicon substrate 12, as shown in FIG. 2.

Figure 3:
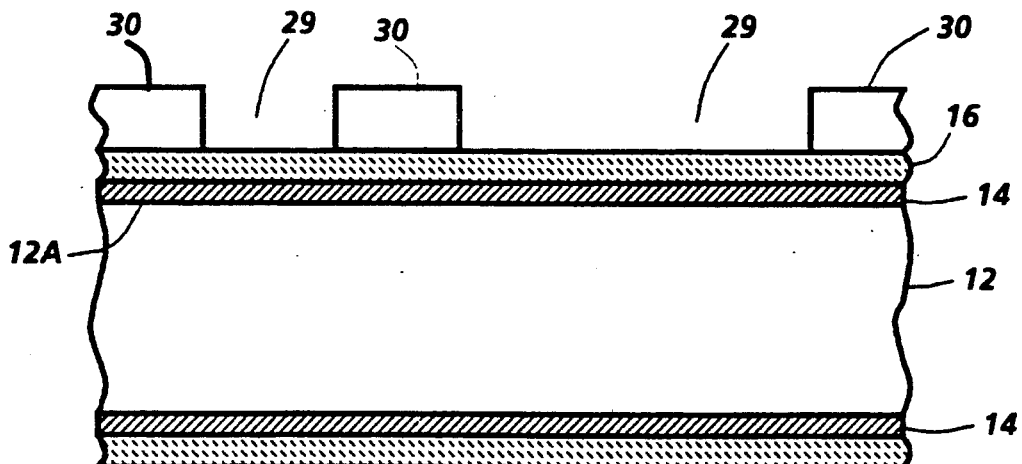
Figure 4:
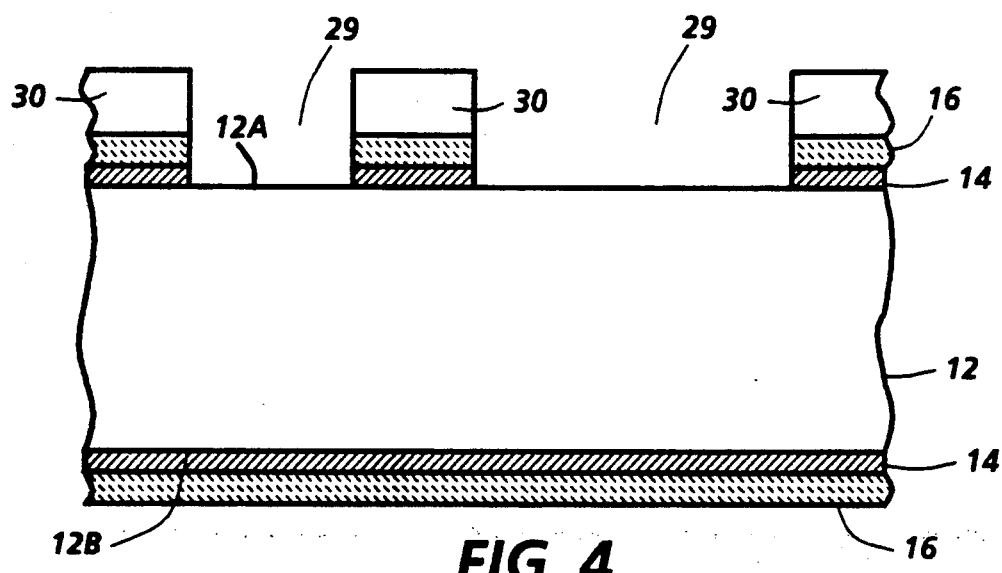

A tipical photoresist or photoimagable layer 30, such as KTI 820 ®, having a thickness of about 0.5 to 10 μm is spin coated on the polycrystalline silicon layer 16 on frontside 12A of the silicon substrate 12 by use of a vacuum chuck (not shown), as well known in the semiconductor industry. The photoresist layer is exposed and developed to form the pattern of vias 29 in the photoresist which will be used to etch-pattern subsequently the polycrystalline silicon layer 16 and then the silicon nitride layer 14, as shown in FIG. 3. The exposed polycrystalline silicon layer and underlying silicon nitride layer are sequentially plasma etched, as shown in FIG. 4, to expose the frontside surface 12A of silicon substrate 12. The photoresist layer is stripped next, as shown in FIG. 5, and then the silicon substrate 12 is placed in an etch bath for anisotropically etching the frontside surface 12A in accordance with the patterned masking layer 14 to produce recesses 32 therein and concurrently etching away the mechanically protective layer 16 as shown in FIG. 6. Even though the vias 29 in the masking layer 14 may be of different size to produce recesses of varying depths, including through holes, the etching is done as a single etching process step. When the three dimensional silicon structures 12 are, for example, channel plates, the anisotropically etched recesses 32 are the channels 22 and reservoir 24 as shown in FIG. 8. In this example, the silicon wafer 10, containing a plurality of channel plates, is aligned and mated with a heating element wafer (not shown) and separated into a plurality of individual printheads 17 by a dicing operation, as discussed above with respect to FIGS. 7 and 8.

Figure 9:
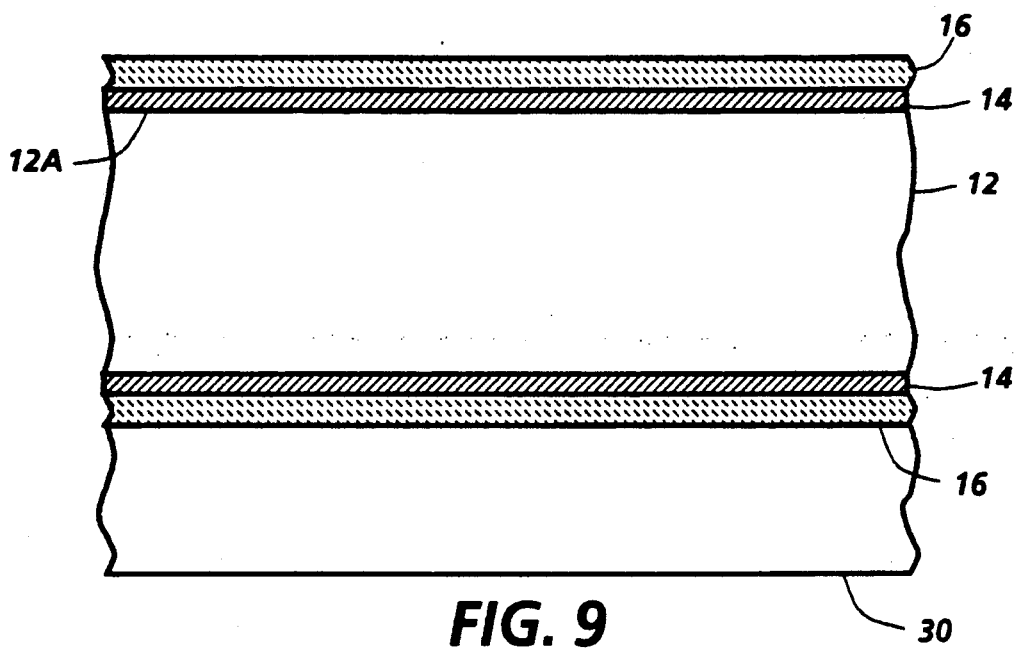
FIGS. 9 and 10 are cross-sectional views of steps in fabricating a three dimensional device of an alternative embodiment of the present invention.
Figure 10:
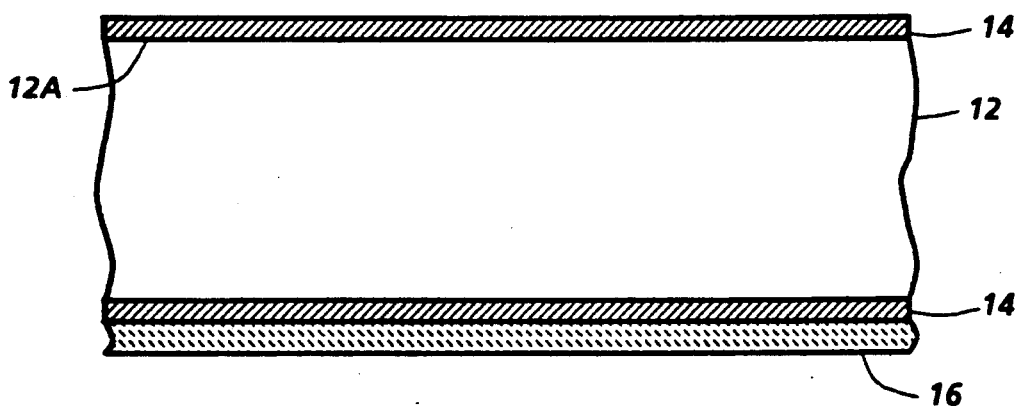

A second method of fabricating a precision etched, three dimensional silicon device is shown in FIGS. 9 and 10, cross-sectional views of a silicon substrate such as a (100) silicon wafer. These FIGS. 9 and 10 show additional sequential steps in the fabricating process discussed above with respect to FIGS. 1 to 6. After sequentially depositing the masking layer 14 and protective layer 16, respectively, as shown in FIGS. 1 and 2, a photoresist layer 30 is deposited on the backside 12B of the wafer 12 over the backside protective layer 16, as shown in FIG. 9. Next, the frontside protective layer is removed, followed by the stripping of the photoresist, as depicted in FIG. 10. The rest of the fabricating process is identical with that of FIGS. 3 through 6, except that the frontside protective layer has been removed. Thus, the patterning of the frontside protective layer 16 prior to the patterning of the underlying masking layer through the vias 29 in the photoresist layer 30 of FIG. 4 is not required because the protective layer on the wafer frontside has already been removed, while the necessary backside protective remains to prevent crack producing damage to the masking layer on the wafer backside. As in the preferred embodiment of FIG. 6, the protective layer of polycrystalline silicon 16 is etch removed concurrently with the anisotropic etching of the wafer in an etch bath using an anisotropic etchant, such as, for example, KOH.

In another fabricating method (not shown) a protective layer is deposited only on the backside of the wafer after the masking layer is deposited on both frontside and backside of the wafer. One example of a protective layer that is depositable only on one side of the wafer is thermally evaporated aluminum. A main requirement of such a protective layer is that it must be removable without damage to masking layer and a layer of thermally evaporated aluminum is removable from silicon nitride without damaging it because selective etches exist.

In summary, this invention discloses the use of a mechanically protective layer over the delicate, mechanical damage prone chemical etch masking layers deposited on silicon wafers to protect the masking layers during normal handling required for processing, such as, for example, their placement on a vacuum chuck for spin coating with a photoresist or photoimagable layer. While silicon nitride has excellent etch resistance to a wide variety of useful chemical etches and is, therefore, the preferred masking layer, its tensile stress makes it tend to readily crack. In the preferred embodiment, a deposition of polycrystalline silicon, the preferred protective layer, on top of the silicon nitride masking film is used, so that the same chemistry for pattern etching the silicon nitride on the frontside can also be used to pattern the protective layer. In another embodiment, the protective layer on the frontside of the wafer is removed prior to patterning the silicon nitride layer on the frontside by first coating the backside protective layer with a photoresist, then stripping it after the frontside protective layer is removed. In a further embodiment, the protective layer is simply deposited on only the backside of the wafer coated with the masking layer, such as, for example, a layer of aluminum.

Many modifications and variations are apparent from the foregoing description of the invention, and all such modifications and variations are intended to be within the scope of the present invention.

We claim:

1. A method of fabricating a precision etched, three dimensional device from a silicon wafer, the wafer having a frontside and a backside surface, the device being produced by etching only the frontside surface of the wafer comprising the steps of:
   (a) depositing an etch resistant masking layer on the frontside and backside surfaces of a clean silicon wafer;
   (b) depositing a mechanical damage protective layer over the masking layer on both the frontside and backside surfaces of the wafer,
   (c) placing the backside surface of the wafer, covered by said masking layer and over lying protective layer, on a chuck means suitable for use in applying a photoimagable layer, whereby the protective layer over the masking layer on the wafer backside surface prevents crack-producing damage to said masking layer resulting from mechanical contact with said wafer during said placement of the wafer on said chuck means;
   (d) applying and patterning a photoimagable layer on the protective layer on the wafer frontside surface to produce a pattern of vias in the photoimagable layer, thereby exposing the protective layer through the vias, while the protective layer on the wafer backside surface prevents damage to the masking layer which could produce cracks in said masking layer, during the application and patterning of the photoimagable layer;
   (e) sequentially etching the protective layer first and then the masking layer exposed through the vias in the photoimagable layer to produce aligned vias therein exposing the frontside surface of the wafer;
   (f) stripping the patterned photoimagable layer from the frontside surface of the wafer; and
   (g) anisotropically etching the wafer in an etch bath, so that the exposed frontside surface of the wafer is etched through the vias in the protective and masking layers to produce the three dimensional device without undesired etching of the backside surface of the wafer through inadvertently produced cracks in the masking layer on the wafer backside surface.

2. The method of claim 1, wherein the etch resistant masking layer is silicon nitride, and the mechanical damage protective layer is polycrystalline silicon, and wherein the anisotropic etching of the wafer in step (g) concurrently etch-removes the polycrystalline silicon layer, thereby leaving a defect-free silicon nitride layer on the three dimensional device.

3. The method of claim 2, wherein the etching in step (e) comprises the steps of wet etching of the polycrystalline silicon followed by plasma etching of the silicon nitride using the same patterned photoresist layer.

4. The method of claim 2, wherein the etching in step (e) is plasma etching.

5. The method of claim 4, wherein the three dimensional device is a plurality of devices; wherein the silicon nitride layer is removed; and wherein the method further comprises a final step of dicing the etched wafer into a plurality of separate devices.

6. The method of claim 5, wherein the plurality of separate devices are ink-flow directing channel plates for mating with a heating element plate containing an array of heating elements on a surface thereof to form thermal ink jet printheads.

7. A method of fabricating a plurality of joined precision etched, three dimensional devices from silicon wafers by etching from only one side of the wafer and then separating the joined devices, comprising the steps of:
  (a) depositing an etch resistant masking layer on both sides of a clean silicon wafer;
  (b) depositing a mechanically protective layer over the masking layer on both sides of the wafer, so that the mechanically fragile masking layer is protected from damage during subsequent fabricating steps;
  (c) placing the wafer with the protective and masking layers on a rotatable vacuum chuck with one side in contact therewith, the protective layer on the side of the wafer contacting the vacuum chuck preventing crack producing damage to masking layer covered thereby during the wafer placement on the vacuum chuck;
  (d) rotating the vacuum chuck and spin coating a photoresist layer on the side of the wafer's protective layer opposite to the one in contact with the vacuum chuck;
  (e) patterning the photoresist layer to expose a predetermined pattern on the wafer's protective layer;
  (f) plasma etching the predetermined pattern of exposed protective layer to remove first the protective layer and then the exposed underlying masking layer to expose the surface of the wafer in said predetermined pattern;
  (g) stripping the patterned photoresist layer from the wafer; and
  (h) etching the exposed wafer surface in an anisotropic etchant bath to produce a plurality of three dimensional devices and concurrently etching and removing the protective layer, so that the masking layer is totally exposed and the three dimensional devices are produced by etching only one wafer surface without undesired etching of the other wafer side through cracks caused by damage to the masking layer thereon.

8. The method of claim 7, wherein the masking layer is silicon nitride and the protective layer is polycrystalline silicon, so that both layers can be sequentially pattern-etched using the same chemistry for the pattern etching in step (f); wherein the silicon wafer surfaces are {100} planes; and wherein the etchant bath is the type which anisotropically etches silicon.

9. The method of claim 8, wherein the plurality of joined devices are ink-flow directing channel plates, each channel plate having a parallel set of ink channels which provide ink flow paths between a reservoir and associated nozzles and wherein the method further comprises the steps of aligning and bonding the plurality of joined channel plates with a silicon wafer containing a plurality of sets of heating element arrays, so that each channel has a heating element therein a predetermined distance upstream from its associated nozzle.

10. The method of claim 9, wherein the method further comprises the dicing of etched wafer into a plurality of individual devices.

11. A method of fabricating a plurality of joined precision etched, three dimensional devices from silicon wafers by etching from only one side of the wafer and then separating the joined devices, comprising the steps of:
  (a) depositing an etch resistant masking layer on both sides of a clean silicon wafer;
  (b) depositing a mechanically protective layer over the masking layer on both sides of the wafer, so that the mechanically fragile masking layer is protected from damage during subsequent fabricating steps;
  (c) placing the wafer with the protective and masking layers on a rotatable vacuum chuck with one side in contact therewith;
  (d) rotating the vacuum chuck and spin coating a first photoresist layer on the side of the wafer's protective layer opposite to the one in contact with the vacuum chuck;
  (e) removing the protective layer on the wafer surface opposite the one with the first photoresist layer;
  (f) stripping the first photoresist layer;
  (g) placing the wafer on a rotatable vacuum chuck with the side having the protective layer being in contact therewith, so that the protective layer prevents crack-producing damage to the masking layer covered thereby;
  (h) rotating the vacuum chuck and spin coating a second photoresist layer on the masking layer;
  (i) patterning the second photoresist layer to expose a predetermined pattern on the wafer's masking layer while the masking layer on the opposite side of the wafer is being concurrently protected by the protective layer from crack-producing mechanical damage;
  (j) plasma etching the predetermined pattern of exposed masking layer to expose the surface of the wafer in said predetermined pattern;
  (k) stripping the patterned second photoresist layer from the wafer; and
  (l) etching the wafer surface exposed in an anisotropic etchant bath to produce a plurality of joined three dimensional devices and concurrently etching and removing the protective layer on the opposite side of the wafer, so that the masking layer is totally exposed and the three dimensional devices are produced by etching only one wafer surface without undesired etching of the other wafer side through cracks in the masking layer thereon caused by mechanical damage thereto.

12. The method of claim 11, wherein the masking layer is silicon nitride and the protective layer is polycrystalline silicon.

* * * * *